(12) United States Patent
Elsaadani et al.

(10) Patent No.: US 12,104,585 B2
(45) Date of Patent: Oct. 1, 2024

(54) VIBRATION ISOLATION TO PROTECT ELECTRICAL CIRCUITS FROM VIBRATION-INDUCED DAMAGE

(71) Applicant: NOKIA SHANGHAI BELL CO., LTD., Shanghai (CN)

(72) Inventors: Asaad Elsaadani, Meriden, CT (US); Jari Taskila, Meriden, CT (US)

(73) Assignee: Nokia Shanghai Bell Co., Ltd., Shanghai (CN)

( * ) Notice: Subject to any disclaimer, the term of this patent is extended or adjusted under 35 U.S.C. 154(b) by 312 days.

(21) Appl. No.: 17/383,666

(22) Filed: Jul. 23, 2021

(65) Prior Publication Data

US 2023/0027815 A1 Jan. 26, 2023

(51) Int. Cl.
*F04B 39/00* (2006.01)
*F16F 15/08* (2006.01)

(52) U.S. Cl.
CPC .......... *F04B 39/0044* (2013.01); *F16F 15/08* (2013.01)

(58) Field of Classification Search
None
See application file for complete search history.

(56) References Cited

U.S. PATENT DOCUMENTS 2,932,546 A * 4/1960 Marggraf ............... B65D 81/07
206/583
4,984,971 A * 1/1991 Bergeron .............. F04B 39/127
417/363

(Continued)

FOREIGN PATENT DOCUMENTS

CN 202175867 U 3/2012
CN 202535011 U 11/2012
(Continued)

OTHER PUBLICATIONS

Ugural, Ansel, Plates and Shells Theory and Analysis, (2018), CRC Press Taylor & Francis Group, Fourth Edition, pp. 293-297 (Year: 2018).*

(Continued)

*Primary Examiner* — Essama Omgba
*Assistant Examiner* — Geoffrey S Lee
(74) *Attorney, Agent, or Firm* — Mendelsohn Dunleavy, P.C.; Steve Mendelsohn

(57) ABSTRACT

A pressurization dehydrator comprising an air compressor and a controller connected to enable automatic operation of the dehydrator. The dehydrator is implemented as a free-standing, bench-top unit having a housing that encloses a baffle plate on which the compressor is mounted. The bottom panel of the housing is affixed to the plate using dampers inserted therebetween. The plate has legs protruding through the corresponding openings in the bottom panel for supporting the whole unit in the upright position on the bench top. Some or all of the legs may not have contact with edges of the openings. In operation, the legs provide an efficient mechanical pathway for transferring some vibrational energy of the plate to the bench top, thereby diverting said energy away from the housing. The circuit board of the controller is affixed to the housing, which beneficially reduces vibration levels transferred to the electronic components of the controller.

21 Claims, 4 Drawing Sheets

(56) References Cited

U.S. PATENT DOCUMENTS

| | | | | |
|---|---|---|---|---|
| 5,040,953 | A | * | 8/1991 | Tinsler .................. F25D 23/006 248/634 |
| 5,306,121 | A | * | 4/1994 | Heflin .................... F16F 15/08 417/363 |
| 5,913,892 | A | * | 6/1999 | Kwon .................. F25D 23/006 62/297 |
| 6,064,287 | A | | 5/2000 | Jones |
| 6,260,373 | B1 | * | 7/2001 | Rockwood .............. F16F 7/104 165/69 |
| 6,540,491 | B1 | * | 4/2003 | Tanabe ................. F04B 35/045 417/416 |
| 6,785,217 | B1 | * | 8/2004 | Kao ................... G11B 19/2009 720/651 |
| 7,168,260 | B2 | * | 1/2007 | Lee ...................... F25D 23/006 62/297 |
| 7,257,961 | B2 | * | 8/2007 | Lee ...................... F25D 23/006 62/295 |
| 7,263,851 | B2 | * | 9/2007 | Yun ...................... F25D 23/006 181/207 |
| 7,398,655 | B2 | * | 7/2008 | Yun ...................... F25D 23/006 181/403 |
| 7,814,760 | B2 | * | 10/2010 | Immel ................ H05K 7/20172 415/140 |
| 9,359,135 | B2 | * | 6/2016 | Nagamine ......... H01L 21/67769 |
| 10,408,526 | B2 | * | 9/2019 | Lokhande ............. F25D 23/006 |
| 2005/0106054 | A1 | | 5/2005 | Daniels et al. |
| 2005/0257552 | A1 | * | 11/2005 | Yun ...................... F25D 23/006 62/295 |
| 2006/0013711 | A1 | | 1/2006 | Kakiuchi |
| 2008/0003111 | A1 | | 1/2008 | Turan |
| 2010/0068078 | A1 | | 3/2010 | Lee |
| 2014/0234100 | A1 | * | 8/2014 | Hamaguchi ........... F04D 29/601 415/213.1 |
| 2016/0184773 | A1 | | 6/2016 | Martin et al. |
| 2018/0119686 | A1 | * | 5/2018 | Shakal .................. F04B 39/127 |
| 2023/0027815 | A1 | * | 1/2023 | Elsaadani ............... F04B 35/04 |

FOREIGN PATENT DOCUMENTS

| | | |
|---|---|---|
| CN | 204030825 U | 12/2014 |
| CN | 204481440 U | 7/2015 |
| CN | 206686016 U | 11/2017 |

OTHER PUBLICATIONS

Mukherjee, Sabyasachi "A Theoretical Study and 3D Modeling of Nonlinear Passive Vibration Isolator." International Journal of Applied and Advanced Scientific Research 2.2 (2017): 159-168.

Vibration Damping, ardupilot.org, 2016 [retrieved on May 13, 2021] Retrieved from the Internet: <URL: https://ardupilot.org/rover/docs/common-vibration-damping.html#common-vibration-damping> (9 pages).

Gordeev, B. A., et al. "Vibration Dampers Simulation Tests on the Experimental Setup." 2017 International Conference on Industrial Engineering, Applications and Manufacturing (ICIEAM), doi: 10.1109/ICIEAM.2017.8076480. (2017): 1-5.

G&M Tech Inc. "Vacuum Pumps & Air Compressor Series: AC Version." Product Catalog (2019): 1-8.

Crede, Charles E., et al. "Chapter 30: Theory of Vibration Isolation." Harris' Shock and Vibration Handbook 5th ed. McGraw-Hill (1996): pp. 30-31, 30-7.

Extended European Search Report for corresponding European application No. 22180641.7; dated Dec. 8, 2022 (9 pages).

* cited by examiner

100

200

300

210

210

210

VIBRATION ISOLATION TO PROTECT ELECTRICAL CIRCUITS FROM VIBRATION-INDUCED DAMAGE

BACKGROUND

Field

Various example embodiments relate to vibration isolation and, more specifically but not exclusively, to protecting electrical circuits from vibration-induced damage.

Description of the Related Art

This section introduces aspects that may help facilitate a better understanding of the disclosure. Accordingly, the statements of this section are to be read in this light and are not to be understood as admissions about what is in the prior art or what is not in the prior art.

An air compressor is a pneumatic device that generates pressurized (i.e., compressed) air e.g., using an electric motor or a gasoline engine. By one of several methods, an air compressor forces more and more air into a storage or buffer tank, thereby increasing the air pressure therein. When the tank's pressure reaches a selected upper limit, the air compressor shuts off. The compressed air from the tank may be used for a variety of home, professional, or industrial applications, such as powering pneumatic tools or providing moderate-pressure air supply through an air-distribution system. As the air is released from the tank for its intended use, the tank depressurizes. When the tank's pressure reaches a selected lower limit, the air compressor turns on again and re-pressurizes the tank.

Most air compressors can be classified as reciprocating-piston type, rotary-vane type, or rotary-screw type. Centrifugal compressors are more common in large applications, whereas reciprocating-piston and rotary-screw air compressors are favored for smaller or portable applications. Air compressors can be oil-lubed or oil-less. An oil-less air compressor typically delivers air of better quality, but can be more expensive, louder, and/or less durable than the oil-lubed variety.

SUMMARY OF SOME SPECIFIC EMBODIMENTS

Disclosed herein are embodiments of a pressurization dehydrator comprising an air compressor, desiccant-filled cylinders, an airflow-management system, and an electronic controller connected to enable unattended, automatic operation of the dehydrator. In an example embodiment, the dehydrator is implemented as a self-contained, freestanding, bench-top unit having a housing that encloses, inter alia, a baffle plate on which the air compressor is mounted. The bottom panel of the housing is attached to the bottom of the baffle plate using a set of rubber dampers inserted therebetween. The baffle plate has rubber legs protruding through the corresponding openings in the bottom panel of the housing for supporting the whole unit in the upright position on the bench top. For example, some or all of the legs may not have contact with the edges of the openings or with the housing. In operation, the baffle plate and rubber legs provide a direct pathway for efficient transfer of vibration from the air compressor and/or baffle plate to the bench top while the rubber dampers may also restrict the transfer of vibration to the housing. The circuit board of the electronic controller is attached to the housing, which beneficially reduces vibration levels transferred to the electronic components of the controller and helps to prolong the service life of the dehydrator.

The disclosed vibration-isolation solutions are also effective in reducing the noise levels generated by the dehydrator in operation.

At least some of the vibration-isolation solutions disclosed herein may be applicable to other freestanding bench-top units (not necessarily dehydrators) comprising a vibration source and electronic components susceptible to vibration-induced damage.

According to an example embodiment, provided is an apparatus, comprising an assembly that comprises: a housing including a first panel; a base plate being in the housing and having opposing first and second main surfaces; a motor being in the housing and being mechanically attached to the base plate over the first main surface; and a plurality of legs mechanically fixed to the base plate and extending from the second main surface; and wherein the first panel is affixed to the base plate using a plurality of mechanical spacers located between the second main surface and the first panel, each one of the legs protruding through an opening in the first panel, the assembly being configured to freestand on an external surface via support of the legs.

According to another example embodiment, provided is an apparatus, comprising an assembly that comprises: a base plate having opposing first and second main surfaces; a motor mechanically affixed to the base plate over the first main surface; a plurality of legs attached to the base plate and extending from the second main surface; and a panel mechanically affixed to the base plate using a plurality of spacers, the spacers creating separation between the second main surface and the panel, each one of the legs protruding through a respective opening in the panel, the assembly being configured to freestand on an external surface via support of the legs.

BRIEF DESCRIPTION OF THE DRAWINGS

Other aspects, features, and benefits of various disclosed embodiments will become more fully apparent, by way of example, from the following detailed description and the accompanying drawings, in which.

DETAILED DESCRIPTION

A dehydrator is an important element of a communications system employing radio-frequency (RF) waveguides, coaxial cables, and/or rigid transmission lines. For example, in some of such systems, pressurized dry air may be used to control the dielectric constant inside the waveguide or cable, e.g., to prevent the RF energy from arcing therein. Such arcing can damage the waveguide or cable and can also present a short circuit to the corresponding RF power amplifier. As a result, the power amplifier can sustain major damage as well. With the use of pressurized dry air, the problems associated with arcing, corrosion, contamination, and/or water condensation are greatly alleviated, which beneficially improves the overall reliability of the corresponding communication system. As another example, some frequencies in the microwave range are strongly attenuated by moisture. The use of pressurized dry air in microwave waveguides can significantly reduce moisture buildup therein, thereby beneficially decreasing detrimental microwave-signal attenuation.

In high-power waveguide/cable runs, the dry-air pressure can typically be approximately 20 to 35 psig. In low-power waveguide/cable applications, the dry-air pressure can typically be approximately 1 to 15 psig.

Figure 1:
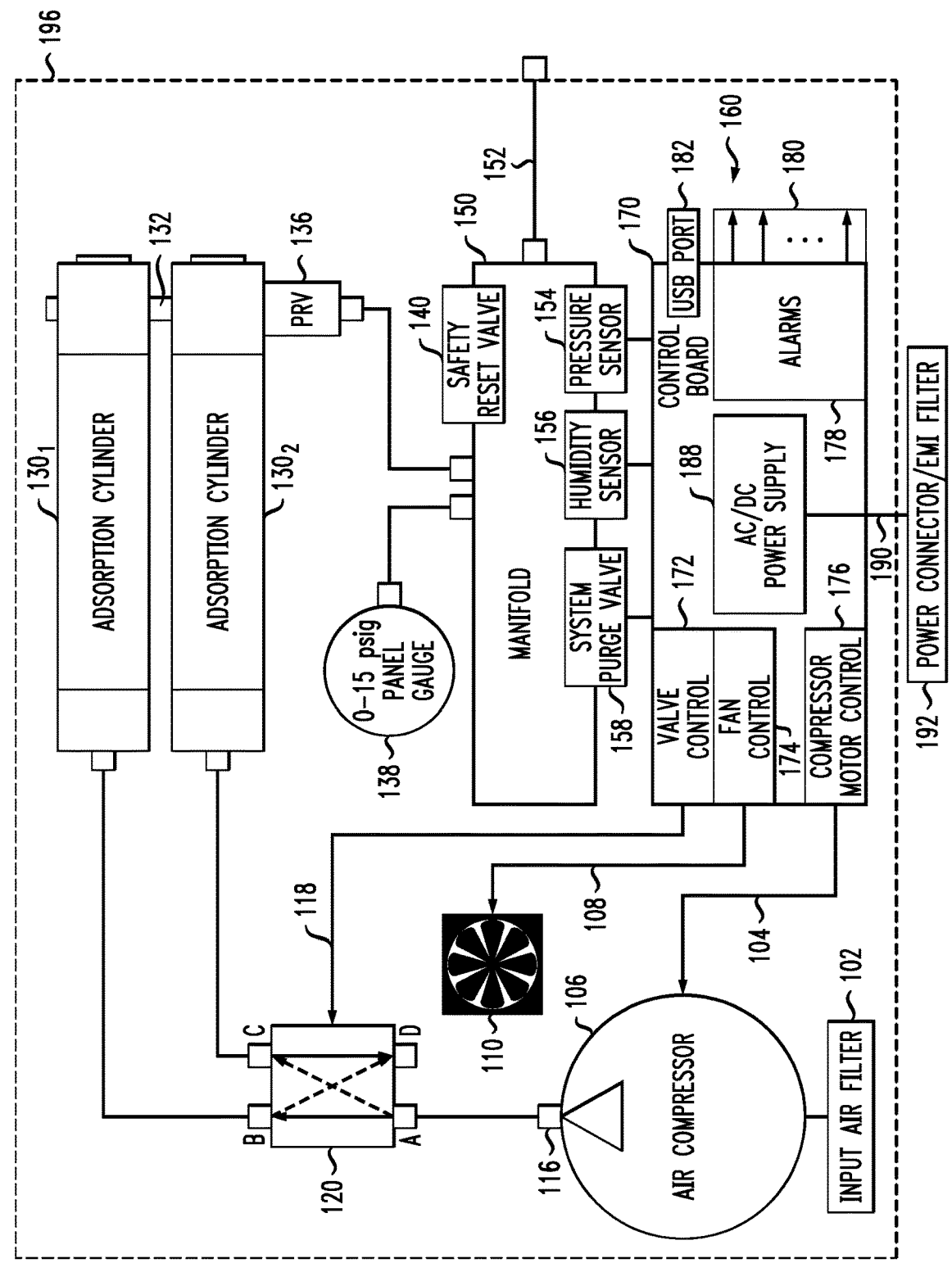
FIG. 1 shows a block diagram of an example dehydrator system in which various embodiments can be practiced.

FIG. 1 shows a block diagram of an example dehydrator system 100 in which various embodiments can be practiced. System 100 is an automatic pressurization dehydrator designed for reliable dry-air pressurization of RF waveguides, coaxial cables, and rigid transmission lines. Some embodiments of system 100 may be designed for operation in enclosed, climate-controlled spaces, wherein ambient air has a temperature between 0° C. and 40° C. and a relative humidity between 5% and 85%.

System 100 comprises an air compressor 106 having an output port 116 connected, via a valve 120, to adsorption cylinders $130_1$ and $130_2$. Valve 120 has four ports, labeled A-D. Port A is externally connected to output port 116 to receive therefrom the pressurized air generated by air compressor 106. Port B is externally connected to adsorption cylinder $130_1$. Port C is externally connected to adsorption cylinder $130_2$. Port D is an exhaust port. The configuration of valve 120 is controlled using a control signal 118 generated by a valve-control circuit 172. In a first valve configuration (indicated in FIG. 1 by the solid arrows), port A is internally connected to port B, and port C is internally connected to port D. In a second valve configuration (indicated in FIG. 1 by the dashed arrows), port A is internally connected to port C, and port B is internally connected to port D.

Adsorption cylinders $130_1$ and $130_2$ are filled with a desiccant suitable for a pressure-swing adsorption/desorption cycle. The use of two adsorption cylinders 130 in system 100 enables nearly continuous production of dry air as explained in more detail below. In an example embodiment, the desiccant can be a high-efficiency alumino-silicate molecular sieve. In alternative embodiments, other suitable desiccants may similarly be used.

In operation, air compressor 106 draws ambient air in through an air filter 102. Air compressor 106 compresses the air and applies the pressurized air to port A of valve 120. Depending on the configuration of valve 120, either cylinder $130_1$ or cylinder $130_2$ is connected to receive the pressurized air from air compressor 106. The cylinder connected to air compressor 106 is thus at a high pressure and is referred to as the "active" cylinder. In an example embodiment, such high pressure can be approximately 100 psi. The other cylinder is connected to the exhaust port D of valve 120 and is therefore at a low pressure, e.g., slightly higher than the ambient atmospheric pressure. Said other cylinder is referred to as the "resting" cylinder. Cylinders $130_1$ and $130_2$ are also connected to one another via an air conduit 132 such that the active cylinder can provide a small purge flow of dry air to the resting cylinder.

The desiccant of the active cylinder removes moisture from the pressurized air due to adsorption of the water molecules on the surface of the desiccant. When the active cylinder becomes nearly saturated to its water-adsorption capacity, valve-control circuit 172 can change the configuration of valve 120, thereby switching the cylinders. The previously active cylinder becomes the resting cylinder, and the previously resting cylinder becomes the active cylinder. Due to being at a low pressure, the desiccant of the resting cylinder releases the adsorbed water, which is then flushed out by the above-mentioned purge flow and exhausted through the exhaust port D of valve 120. After sufficient purging time, the resting cylinder is freed of the previously adsorbed water, restores its water-adsorption capacity, and can be switched back to become the active cylinder again. This cylinder-switching cycle can be repeated to enable nearly continuous production of dry air by system 100.

System 100 further comprises a manifold chamber 150 connected to adsorption cylinders $130_1$ and $130_2$ via a pressure-reducing valve (PRV) 136. PRV 136 is designed to keep a lower pressure in manifold chamber 150 compared to the pressure in the active cylinder, with such lower pressure being near a selected pressure setpoint. In operation, PRV 136 opens as the pressure in manifold chamber 150 falls below the pressure setpoint, thereby letting the dry air from the active cylinder into the manifold chamber, and closes as the pressure rises above the pressure setpoint, thereby disconnecting the active cylinder from the manifold chamber. In an example configuration of PRV 136, the pressure setpoint can be between 5 psig and 15 psig. The pressurized dry air from manifold chamber 150 is directed through an output port or valve to an output line 152, which can be further connected to the corresponding air-distribution system, e.g., configured to deliver the dry air to waveguides and/or coaxial cables of the served communication system.

In an example embodiment, manifold chamber 150 may have additional ports for connecting sensors, gauges, additional valves, etc. In the example embodiment shown in FIG. 1, manifold chamber 150 has connected thereto a pressure gauge 138, a safety valve 140, a pressure sensor 154, a humidity sensor 156, and a system-purge valve 158. Pressure gauge 138 can be a mechanical pressure gauge configured to measure the pressure inside manifold chamber 150. In an example embodiment, pressure gauge 138 has a dial indicator that enables the human operator to visually read the pressure measurement. Pressure sensor 154 and humidity sensor 156 operate to measure the pressure and humidity, respectively, inside manifold chamber 150 and provide the measurement results, e.g., in the form of voltages, to an electronic controller 160. Safety valve 140 provides protection against accidental over-pressurization of manifold chamber 150. System-purge valve 158 is controlled by controller 160 and can be opened, e.g., when chamber 150 needs to be depressurized or purged.

Electronic controller 160 includes circuitry that enables unattended, automatic operation of system 100. In an example embodiment, controller 160 is implemented using a printed circuit board (PCB) 170 on which various constituent circuits (e.g., 172-178) of the controller are mounted and appropriately electrically connected to one another to enable the intended control functions of the controller. In an example embodiment, controller 160 can be connected to an electrical outlet using a conventional IEC power cord 190, which may also comprise an (optional) electromagnetic-interference (EMI) filter 192. Power cord 190 is electrically connected to an AC/DC power supply 188, which may also be mounted on the PCB 170. Power supply 188 is further electrically connected to other circuits of controller 160 and operates to generate and provide appropriate power-supply voltages/currents therefor.

As an example, FIG. 1 shows electronic controller 160 as comprising the above-mentioned valve-control circuit 172, a fan-control circuit 174, a compressor-control circuit 176, and an alarm circuit 178. A person of ordinary skill in the art will readily understand that, in alternative embodiments, controller 160 may include additional and/or different control circuits (not explicitly shown in FIG. 1).

As already indicated above, valve-control circuit 172 operates to generate control signal 118, in response to which valve 120 can change its configuration.

Fan-control circuit 174 operates to generate a control signal 108, in response to which a housing fan 110 can turn on and off. In an example embodiment, fan 110 operates to provide positive-pressure, cooling air for the housing interior. In an example configuration, fan-control circuit 174 may turn on the fan 110 when air compressor 106 is running. In some embodiments, control signal 108 may also be used to control the speed of fan 110, e.g., in response to a temperature reading received from an appropriately positioned temperature sensor (not explicitly shown in FIG. 1).

Compressor-control circuit 176 operates to generate a control signal 104, in response to which the electrical motor of air compressor 106 can turn on and off. In an example embodiment, control signal 104 may be generated partially in response to the measurements received from sensors 154 and 156.

Alarm circuit 178 operates to generate various status indicators and alarms in response to signals received from various sensors and performance-monitoring circuits. The status indicators may be used to provide visual signals to the human operator, e.g., in the form of variously colored LED indicator lights on the front panel of system 100. The alarms are electrical signals that can be received, through an alarm port 180, by remote monitoring equipment (not explicitly shown in FIG. 1) to obtain the present status of system 100. In an example embodiment, the status indicators and alarms may report on at least some of the following example conditions:

(i) High pressure. The high-pressure alarm and/or indicator can be used as a warning that the pressure in chamber 150 is too high. A high distribution-system pressure is undesirable, e.g., because it can damage the corresponding RF waveguide or cable;

(ii) Elevated humidity. The elevated-humidity alarm and/or indicator can be used as a warning that the dryness of the air in chamber 150 is not sufficient, which may cause condensation in the corresponding RF waveguide or cable, e.g., if the temperature drops at nighttime;

(iii) Long run time. The run-time alarm and/or indicator can be used as a warning that the active-pumping duration for air compressor 106 is too long. The occurrence of this alarm typically indicates a leak in the air-distribution system;

(iv) System purge. The system-purge option allows the air-distribution system to occasionally or periodically be drained and purged, and then refilled with freshly pressurized dry air.

In an alternative embodiment, additional and/or different status indicators and/or alarms may be implemented.

Electronic controller 160 further comprises a data (e.g., USB) port 182. In an example embodiment, data port 182 can be used, e.g., for downloading system-operation logs, updating the system's installed options and configurations, performing remote troubleshooting, and updating the system software.

In an example embodiment, system 100 is implemented as a self-contained, freestanding, bench-top unit having a housing 196 (also see FIG. 3) that encloses the above-described system components, with the exception of power cord 190 and possibly an end connector of output line 152. Herein, the term "bench top" refers to a surface onto which system 100, in the housing thereof, can be placed in the upright position and appropriately connected (electrically and to the corresponding air-distribution system) for proper operation. A substantially horizontal and flat surface is preferred, although small tilt angles (e.g., smaller than about 10 degrees) and/or some vertical height variation and texture along the surface may be acceptable for some embodiments. The "bench-top" surface can, for example, be a surface of a desk, table, shelf, bench, cabinet, compartment, floor, foundation, pavement, etc.

In an example embodiment, housing 196 may have a shape of a substantially rectangular box (e.g., substantially a cuboid) constructed using several panels mounted on a frame. Herein, the term "cuboid" refers to a three-dimensional shape in which each of its six faces is a rectangle, and each pair of adjacent faces meets at a right angle. Housing 196 may have one or two handles attached to the exterior thereof, e.g., for convenient carrying and handling the assembled system 100. One of the panels of housing 196 can be configured as a front panel and have openings thereon, e.g., for a power switch, the above-mentioned dial indicator of pressure gauge 138, the above-mentioned LED indicators, data port 182, etc. One or more of the panels of housing 196 may have air intake louvers to provide adequate airflow from the housing exterior to air filter 102 of air compressor 106. One of the panels of housing 196 may have an air intake for the housing fan 110. Several examples of panels that can be used to make housing 196 are described in more detail below in reference to FIGS. 2-3.

When running, air compressor 106 typically generates relatively high levels of vibration and noise. The compressor vibration causes housing 196 to vibrate as well, which transfers various levels of vibration to all system components housed therein. In particular, significant levels of vibration can be transferred to electronic controller 160 and to various components thereof, such as the above-described PCB 170 and control circuits 172-178. Disadvantageously, prolonged exposure to such vibration can damage PCB 170, control circuits 172-178, and/or other vital components of electronic controller 160, thereby rendering system 100 unusable.

Various embodiments disclosed herein are directed at alleviating the vibration, noise, and associated electronics-damage issues in system 100 by providing improved vibration isolation of air compressor 106 from at least electronic controller 160. Advantageously, the resulting reduced vibration levels transferred to electronic controller 160 help to prolong the service life of system 100. At least some of the vibration-isolation solutions disclosed herein may be applicable to some other self-contained, freestanding, bench-top units (not necessarily dehydrators) comprising a shock or vibration source (e.g., a motor, rotor, shaft, piston, gear box, etc.) and electronic components susceptible to shock- or vibration-induced damage.

Figure 2:
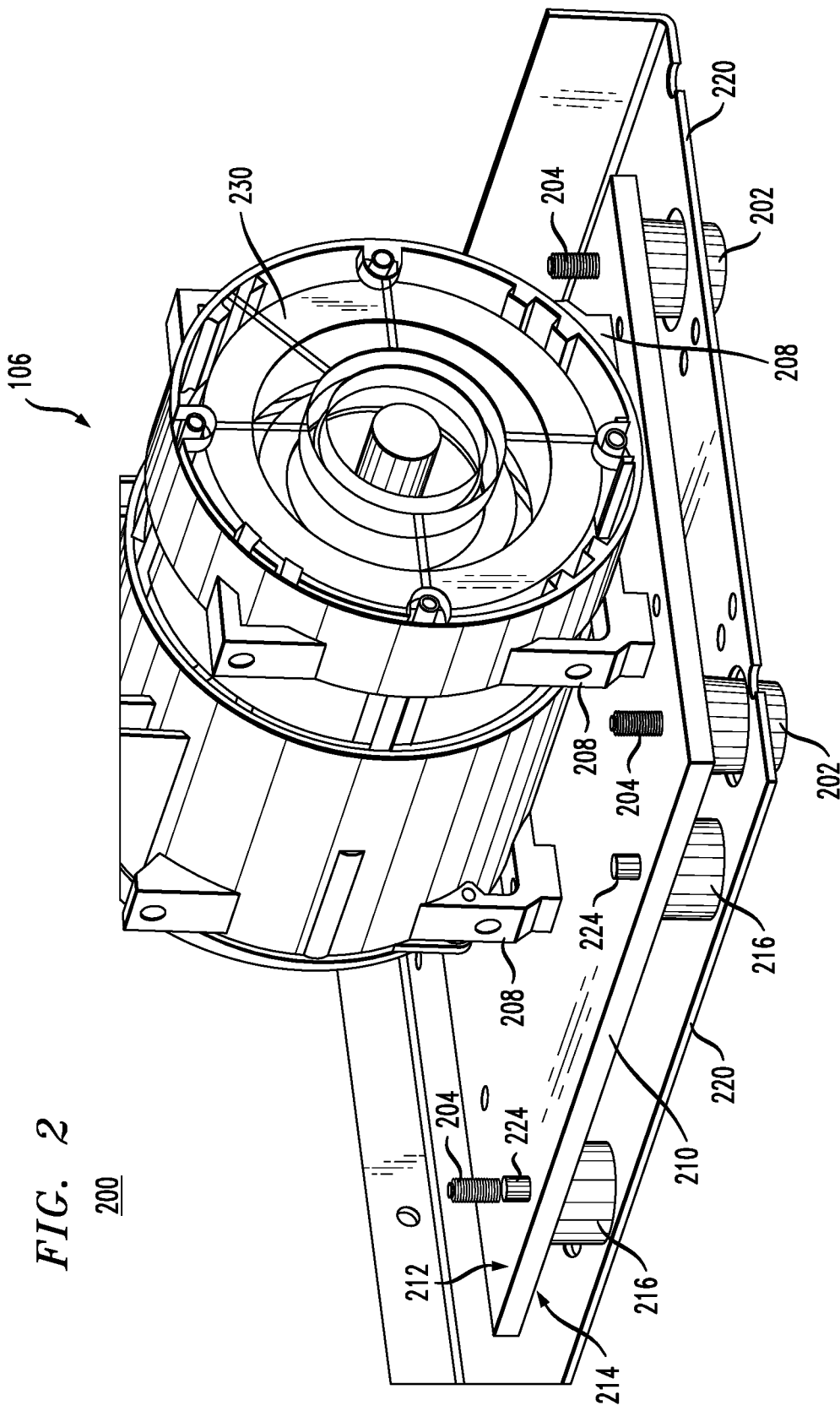
FIG. 2 shows a three-dimensional perspective view of a partial assembly of the dehydrator system of FIG. 1 according to an embodiment.

FIG. 2 shows a three-dimensional perspective view of an assembly 200 that can be used in system 100 (FIG. 1) according to an embodiment. More specifically, assembly 200 may be viewed as representing a partially assembled system 100 at a relatively early assembly-line stage.

Assembly 200 comprises a base plate 210 on which air compressor 106 is mounted by having mounting legs or brackets 208 thereof directly attached to the base plate, e.g., using screws or other suitable attachment method. In an example embodiment, air compressor 106 may have four mounting legs or brackets 208, only three of which are visible in the perspective view shown in FIG. 2. In an alternative embodiment, air compressor 106 may have a different (from four) number of mounting legs or brackets attached to base plate 210. Air compressor 106 is shown in FIG. 2 without its cover plate, which makes visible an electrical motor 230 used to drive the air compressor.

In an example embodiment, base plate 210 can be a planar rectangular plate cut out of a sheet of metal, such as aluminum, steel, or metal alloy. Base plate 210 may have holes drilled therein, e.g., for accepting screws and for other technological purposes. Base plate 210 may have a thickness in the range, e.g., between 2 and 10 mm. The thickness of base plate 210 is typically significantly smaller than the lateral dimensions thereof, which can be, e.g., about 15 cm (width)×20 cm (length).

Base plate 210 has opposing main surfaces 212 and 214, referred to herein as the top surface and bottom surface, respectively. A "main surface" of an object, such as a plate, a substrate, or a circuit board, is an exterior surface thereof that has the largest sizes, e.g., length and width, among all exterior surfaces of the object. The feature height variation along the main surface may be much smaller than length or width, or both length and width, of said surface. In such cases, such main surface may be referred to as a substantially planar surface. The exterior surfaces of the object that have one relatively large size, e.g., length, and one relatively small size, e.g., height, are typically referred to as the edges of the object.

Air compressor 106 is attached to base plate 210 adjacent and along the top surface 212 thereof.

Assembly 200 further comprises rubber legs 202 extending from the bottom surface 214 of base plate 210. In the shown embodiment, each of rubber legs 202 is attached to base plate 210 using a respective attachment screw 204 screwed into a respective threaded hole in the base plate. In the shown embodiment, assembly 200 has four rubber legs 202 located near the corners of base plate 210. Only two of the four rubber legs 202 and only three of the corresponding four attachment screws 204 are visible in the perspective view shown in FIG. 2. In an alternative embodiment, assembly 200 may have a different number (e.g., three or more than four) rubber legs 202 attached to base plate 210.

Rubber legs 202 are configured to bear and support the full weight of the fully assembled system 100 when the system is placed on a horizontal surface, e.g., on the corresponding bench top. For example, a bottom panel 220 of housing 196 (also see FIG. 1) does not have any additional legs directly attached thereto for providing partial support to the fully assembled system 100 on such bench top. However, in some embodiments, one or more of such additional legs may be provided, e.g., for enhanced rocking-motion stability of the fully assembled system 100 on such bench top.

In an example embodiment, housing panel 220 is attached to base plate 210 using four (e.g., bolt-and-nut) fasteners 224, only two of which are partially visible in the perspective view shown in FIG. 2. Each of fasteners 224 is inserted into the corresponding aligned holes in base plate 210 and housing panel 220 and is also fed through a vertical hole of a corresponding rubber spacer 216 placed between the base plate and the housing panel. Only two of the four rubber spacers 216 are visible in the perspective view shown in FIG. 2. Fasteners 224 are tightened to provide a desired degree of compression of spacers 216. The thickness (i.e., vertical size) of spacers 216 and the height of rubber legs 202 are selected such that: (i) rubber legs 202 protrude through the corresponding openings in housing panel 220; and (ii) housing panel 220 pressed against spacers 216 by fasteners 224 is positioned in the gap between the bottom surface 214 of base plate 210 and the bench-top surface on which rubber legs 202 are standing, without directly touching either the base plate or the bench top.

In an alternative embodiment, assembly 200 may have a different (from four) number of spacers 216.

In various embodiments, legs 202 and/or spacers 216 can be made of rubber materials selected from the following non-exclusive list: neoprene rubber; silicone rubber, nitrile rubber, Ethylene Propylene Diene Monomer (EPDM) rubber, styrene-butadiene rubber, butyl rubber, and fluorosilicone rubber. In some embodiments, legs 202 and/or spacers 216 can be made of other suitable materials, such as polymers, composites, metal alloys, etc.

In operation, base plate 210 and rubber legs 202 provide a mechanical pathway for channeling vibrational energy from air compressor 106 or from the base plate 210, to which the air compressor 106 is mechanically attached, directly to the bench top. This direct mechanical pathway does not directly traverse any parts of housing 196 and may also not directly contact housing 196 and, as such, this mechanical pathway is relatively effective in diverting a significant portion of the vibrational energy away from housing 196. For example, an advantageous ~45% reduction in the vibration levels of housing 196 is experimentally observed for assembly 200 compared to typical vibration levels observed for the housing of a comparable assembly in which air compressor 106 is directly mounted on the bottom panel of the housing, and the bottom panel has rubber legs directly attached thereto and standing on the bench top.

Figure 3:
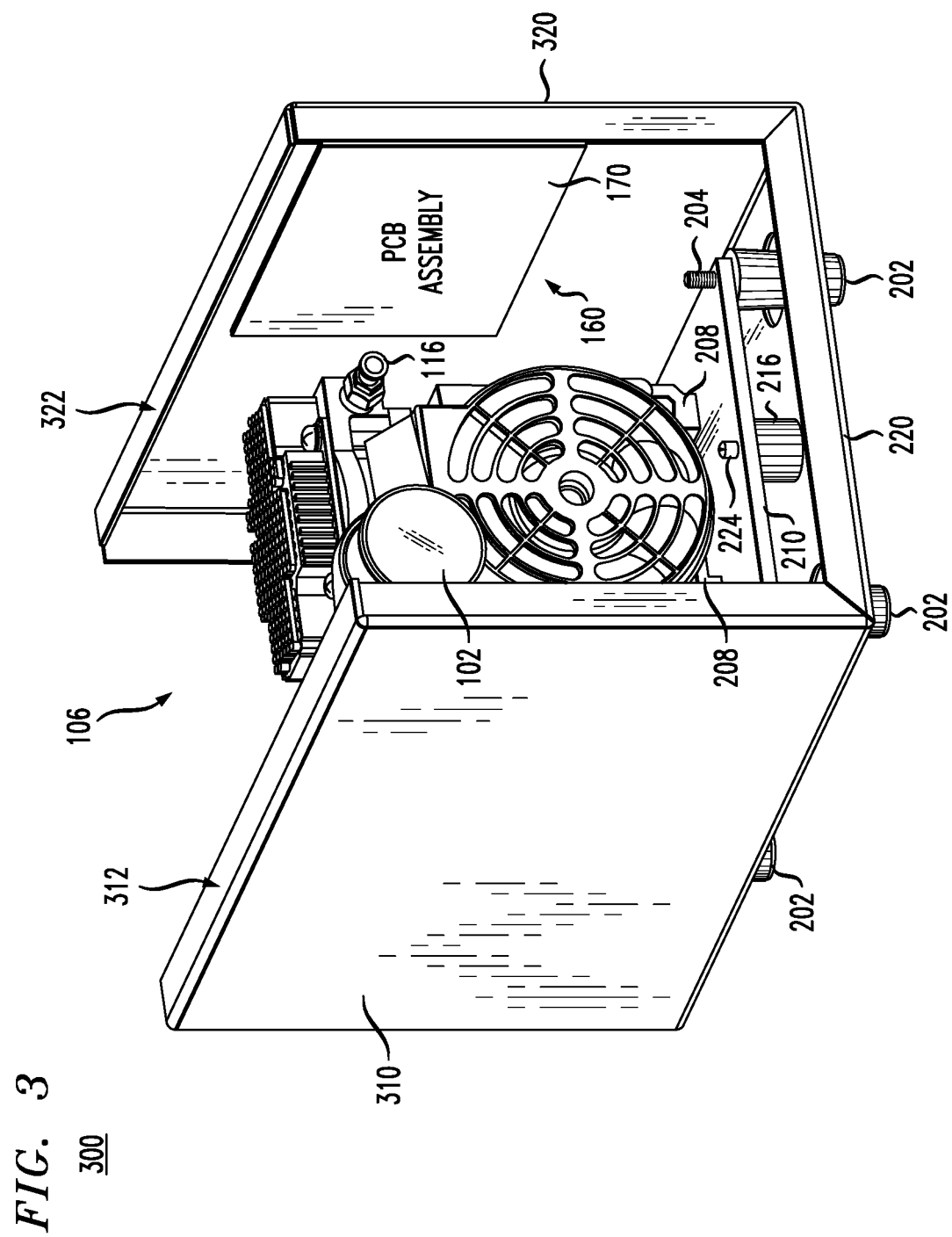
FIG. 3 shows a three-dimensional perspective view of another partial assembly of the dehydrator system of FIG. 1 according to an embodiment.

FIG. 3 shows a three-dimensional perspective view of an assembly 300 that can be used in system 100 (FIG. 1) according to an embodiment. Assembly 300 may be viewed as representing a partially assembled system 100 at a later assembly-line stage than that corresponding to assembly 200 (FIG. 2). More specifically, compared with assembly 200, assembly 300 additionally includes at least: (i) vertical side panels 310 and 320 of housing 196 attached to the bottom panel 220 thereof as shown in FIG. 3; and (ii) electronic controller 160 having the PCB 170 thereof attached to side panel 320 of housing 196 as indicated in FIG. 3.

From the assembly stage shown in FIG. 3, the process of completing housing 196 to its intended substantially cuboid shape may include, e.g., attaching a Π-shaped lid (not explicitly shown in FIG. 3) to assembly 300. For example, such attaching may include the steps of: (A) positioning the Π-shaped lid directly above assembly 300; (B) sliding the end sections of the Π-shaped lid down along the vertical edges of housing panels 310 and 320 to the position in which the middle section of the Π-shaped lid bridges the space between an upper horizontal edge 312 of housing panel 310 and an upper horizontal edge 322 of housing panel 320; and (C) securing the lid so positioned by screw-attaching the lid to the corresponding edges of housing panels 220, 310, and 320. After the Π-shaped lid is attached, the resulting completed housing 196 will fully enclose base plate 220, air compressor 106, and controller 160.

In the example embodiment shown in FIG. 3, PCB 170 of electronic controller 160 is attached to side panel 320 of housing 196 such that the corresponding main surfaces of the PCB and side panel are parallel to each other. In an alternative embodiment, PCB 170 may be edge-attached to side panel 320 such that the main surfaces of the PCB and side panel are mutually orthogonal. In other alternative embodiments, other geometric arrangements for attaching PCB 170 to housing 196 may also be used. It is preferred however that the attached PCB 170 and other circuits (e.g., 172-180, 188) of controller 160 are not in direct physical contact with base plate 210 or with any parts of air compressor 106.

Also directly visible in the perspective view of FIG. 3 are the cap of air filter 102 and output port 116 of air compressor 106 (also see FIG. 1).

Figure 4A:
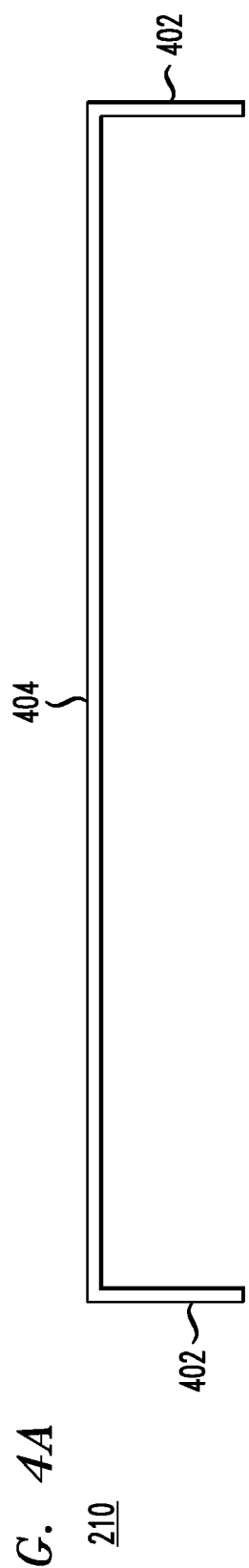
FIGS. 4A-4C show schematic cross-sectional side views of a base plate that can be used in the dehydrator system of FIG. 1 according to several alternative embodiments.
Figure 4B:
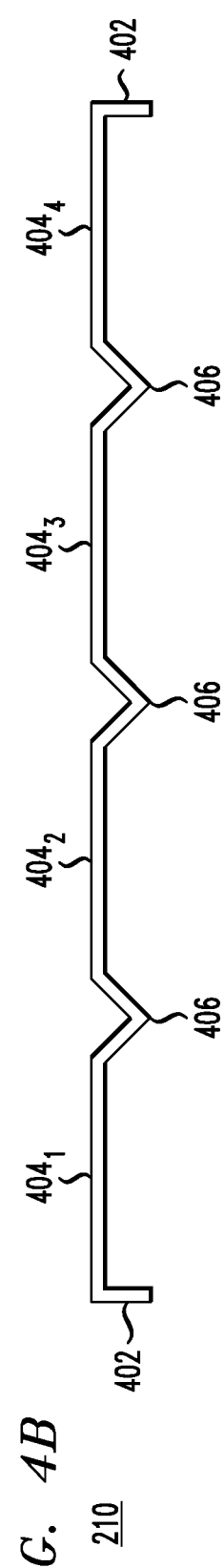
Figure 4C:
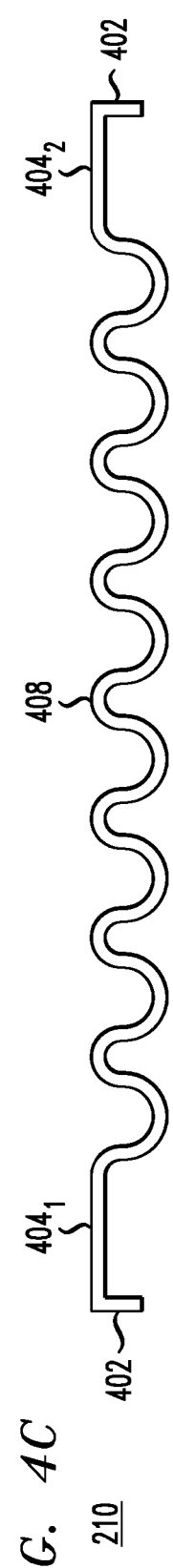

FIGS. 4A-4C show schematic cross-sectional side views of base plate 210 according to several alternative embodiments. In each of these embodiments, the respective base plate 210 has a greater stiffness than the comparable flat-plate embodiment of base plate 210 shown in FIGS. 2-3. The increased stiffness of base plate 210 helps to more-favorably partition the transfer of vibrational energy from air compressor 106, with a relatively larger vibrational-energy portion being transferred to the bench top. The corresponding relative reduction in the vibrational energy transferred to housing 196 may be beneficial as it further reduces the risk of vibration-induced damage to controller 160.

In the embodiment of FIG. 4A, base plate 210 has vertical lips 402 along the perimeter of a flat middle portion 404 thereof. The height of a lip 402 can be, e.g., in the range between 2 and 10 mm. The heights of lips 402 may be selected for optimal vibration-isolation performance and may depend on the used material(s), the thickness and lateral sizes of middle portion 404, the number and location of legs 202, the number and location of spacers 216, etc.

In the embodiment of FIG. 4B, in addition to vertical lips 402, base plate 210 has a plurality of V-shaped grooves 406 impressed into the middle portion 404 thereof. As an example, base plate 210 having three grooves 406 interleaved with flat portions $404_1$-$404_4$ is shown in FIG. 4B. A person of ordinary skill in the art will readily understand that an alternative embodiment with a different (from three) number of grooves 406 is also possible.

In the embodiment of FIG. 4C, in addition to vertical lips 402, base plate 210 has a washboard-like middle portion 408 between peripheral flat portions $404_1$ and $404_2$ thereof. The geometric parameters of the "washboard" can be selected for more-optimal vibration-isolation performance and may depend on one or more of the factors already mentioned above.

In some embodiments, additional improvements in the vibration-isolation performance of system 100 can be obtained, e.g., by improving damping in the fully assembled system 100 and/or by relative detuning of the natural oscillation frequencies of the fully assembled system 100 and the forcing frequency generated by air compressor 106. Improved damping can be achieved, e.g., by increasing the number of spacers 216 and more-carefully selecting the material thereof. Relative detuning is generally directed at preventing the forcing frequency generated by air compressor 106 from being near a vibrational resonance of the fully assembled system 100. Such relative detuning can be achieved, e.g., by: (i) using a more-optimally selected set of structural materials; (ii) providing a better support structure for PCB 170; and/or (iii) changing the rpm speed of motor 230.

According to an example embodiment disclosed above, e.g., in the summary section and/or in reference to any one or any combination of some or all of FIGS. 1-4, provided is an apparatus, comprising an assembly (e.g., 300, FIG. 3) that comprises: a housing (e.g., 196, FIG. 1) including a first panel (e.g., 220, FIG. 2); a base plate (e.g., 210, FIG. 2) being in the housing and having opposing first and second main surfaces; a motor (e.g., 230, FIG. 2) being in the housing and being mechanically attached to the base plate over the first main surface; and a plurality of legs (e.g., 202, FIG. 2) mechanically fixed to the base plate and extending from the second main surface; and wherein the first panel is affixed to the base plate using a plurality of mechanical spacers (e.g., 216, FIG. 2) located between the second main surface and the first panel, each one of the legs protruding through an opening in the first panel, the assembly being configured to freestand on an external surface via support of the legs.

In some embodiments of the above apparatus, the legs form a mechanical pathway to transfer vibrational energy between the base plate and the external surface, the legs not contacting the first panel.

In some embodiments of any of the above apparatus, the apparatus further comprises an electronic controller (e.g., 160, FIG. 1) to control the motor.

In some embodiments of any of the above apparatus, the apparatus further comprises a second panel (e.g., 320, FIG. 3) of the housing edge-connected and substantially orthogonal (e.g., to within ±5 degrees) to the first panel; and wherein the electronic controller comprises a circuit board (e.g., 170, FIG. 3) mechanically fixed to the second panel.

In some embodiments of any of the above apparatus, the circuit board is parallel to the second panel (e.g., as indicated in FIG. 3).

In some embodiments of any of the above apparatus, the electronic controller is in the housing.

In some embodiments of any of the above apparatus, the motor is configured to drive an air compressor (e.g., 106, FIG. 1) to pump air through a dehumidifying element (e.g., $130_1$, $130_2$, FIG. 1); and wherein the housing encloses therein the air compressor and the dehumidifying element.

In some embodiments of any of the above apparatus, the spacers are configured to provide damping of vibrations traveling between the base plate and the electronic controller when the motor is running.

In some embodiments of any of the above apparatus, the apparatus further comprises a gas valve (e.g., 120, FIG. 1); wherein the motor is configured to drive an air compressor (e.g., 106, FIG. 1) connected to the gas valve; and wherein the electronic controller is configured to individually control the motor and the gas valve.

In some embodiments of any of the above apparatus, the spacers are configured to provide damping of vibrations traveling between the base plate and the first panel when the electrical motor is running.

In some embodiments of any of the above apparatus, the first panel is substantially parallel (e.g., to within ±5 degrees) to the base plate.

In some embodiments of any of the above apparatus, at least some of the legs do not contact the first panel.

In some embodiments of any of the above apparatus, the first panel does not have an additional leg directly attached thereto to assist the freestanding.

In some embodiments of any of the above apparatus, the base plate comprises: a flat middle portion (e.g., 404, FIG. 4A); and one or more lips (e.g., 402, FIG. 4A) along a perimeter of the base plate.

In some embodiments of any of the above apparatus, the base plate comprises: a plurality of flat portions (e.g., $404_1$-$404_4$, FIG. 4B); and a plurality of grooves (e.g., 406, FIG. 4B) interleaved with the flat portions.

In some embodiments of any of the above apparatus, the base plate comprises: a peripheral flat portion (e.g., $404_1$/$404_2$, FIG. 4C); and a washboard-profiled middle portion (e.g., 408, FIG. 4C).

According to another example embodiment disclosed above, e.g., in the summary section and/or in reference to any one or any combination of some or all of FIGS. 1-4, provided is an apparatus, comprising an assembly (e.g., 200, FIG. 2) that comprises: a base plate (e.g., 210, FIG. 2) having opposing first and second main surfaces; a motor (e.g., 230, FIG. 2) mechanically affixed to the base plate over the first main surface; a plurality of legs (e.g., 202, FIG. 2) attached to the base plate and extending from the second main surface; and a panel (e.g., 220, FIG. 2) mechanically affixed to the base plate using a plurality of spacers (e.g., 216, FIG. 2), the spacers creating separation between the second main surface and the panel, each one of the legs protruding through a respective opening in the panel, the assembly being configured to freestand on an external surface via support of the legs.

While this disclosure includes references to illustrative embodiments, this specification is not intended to be construed in a limiting sense. Various modifications of the described embodiments, as well as other embodiments within the scope of the disclosure, which are apparent to persons skilled in the art to which the disclosure pertains are deemed to lie within the principle and scope of the disclosure, e.g., as expressed in the following claims.

Unless explicitly stated otherwise, each numerical value and range should be interpreted as being approximate as if the word "about" or "approximately" preceded the value or range.

It will be further understood that various changes in the details, materials, and arrangements of the parts which have been described and illustrated in order to explain the nature of this disclosure may be made by those skilled in the art without departing from the scope of the disclosure, e.g., as expressed in the following claims.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Reference herein to "one embodiment" or "an embodiment" means that a particular feature, structure, or characteristic described in connection with the embodiment can be included in at least one embodiment of the disclosure. The appearances of the phrase "in one embodiment" in various places in the specification are not necessarily all referring to the same embodiment, nor are separate or alternative embodiments necessarily mutually exclusive of other embodiments. The same applies to the term "implementation."

Unless otherwise specified herein, the use of the ordinal adjectives "first," "second," "third," etc., to refer to an object of a plurality of like objects merely indicates that different instances of such like objects are being referred to, and is not intended to imply that the like objects so referred-to have to be in a corresponding order or sequence, either temporally, spatially, in ranking, or in any other manner.

Unless otherwise specified herein, in addition to its plain meaning, the conjunction "if" may also or alternatively be construed to mean "when" or "upon" or "in response to determining" or "in response to detecting," which construal may depend on the corresponding specific context. For example, the phrase "if it is determined" or "if [a stated condition] is detected" may be construed to mean "upon determining" or "in response to determining" or "upon detecting [the stated condition or event]" or "in response to detecting [the stated condition or event]."

Throughout the detailed description, the drawings, which are not to scale, are illustrative only and are used in order to explain, rather than limit the disclosure. The use of terms such as height, length, width, top, bottom, is strictly to facilitate the description of the embodiments and is not intended to limit certain embodiments to a specific orientation. For example, height does not imply only a vertical rise limitation, but is used to identify one of the three dimensions of a three-dimensional structure as shown in the figures. The same applies to width and length.

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements. The same type of distinction applies to the use of terms "attached" and "directly attached," as applied to a description of a physical structure. For example, a relatively thin layer of adhesive or other suitable binder can be used to implement such "direct attachment" of the two corresponding components in such physical structure.

The described embodiments are to be considered in all respects as only illustrative and not restrictive. In particular, the scope of the disclosure is indicated by the appended claims rather than by the description and figures herein. All changes that come within the meaning and range of equivalency of the claims are to be embraced within their scope.

The description and drawings merely illustrate the principles of the disclosure. All examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and embodiments of the disclosure, as well as specific examples thereof, are intended to encompass equivalents thereof.

The functions of the various elements shown in the figures, including any functional blocks labeled as "processors" and/or "controllers," may be provided through the use of dedicated hardware as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, application specific integrated circuit (ASIC), field programmable gate array (FPGA), read only memory (ROM) for storing software, random access memory (RAM), and non volatile storage. Other hardware, conventional and/or custom, may also be included.

As used in this application, the term "circuitry" may refer to one or more or all of the following: (a) hardware-only circuit implementations (such as implementations in only analog and/or digital circuitry); (b) combinations of hardware circuits and software, such as (as applicable): (i) a combination of analog and/or digital hardware circuit(s) with software/firmware and (ii) any portions of hardware processor(s) with software (including digital signal processor(s)), software, and memory(ies) that work together to cause an apparatus, such as a mobile phone or server, to perform various functions); and (c) hardware circuit(s) and or processor(s), such as a microprocessor(s) or a portion of a microprocessor(s), that requires software (e.g., firmware) for operation, but the software may not be present when it is not needed for operation." This definition of circuitry applies to all uses of this term in this application, including in any claims. As a further example, as used in this application, the term circuitry also covers an implementation of merely a hardware circuit or processor (or multiple processors) or portion of a hardware circuit or processor and its (or their) accompanying software and/or firmware.

It should be appreciated by those of ordinary skill in the art that any block diagrams herein represent conceptual views of illustrative circuitry embodying the principles of the disclosure.

"SUMMARY OF SOME SPECIFIC EMBODIMENTS" in this specification is intended to introduce some example embodiments, with additional embodiments being described in "DETAILED DESCRIPTION" and/or in reference to one or more drawings. "SUMMARY OF SOME SPECIFIC EMBODIMENTS" is not intended to identify essential elements or features of the claimed subject matter, nor is it intended to limit the scope of the claimed subject matter.

What is claimed is:

1. An apparatus, comprising an assembly that comprises:
a housing including a first panel;
a base plate being in the housing and having opposing first and second main surfaces;
a motor being in the housing and being mechanically attached to the base plate over the first main surface; and
a plurality of legs mechanically fixed to the base plate and extending from the second main surface; and
wherein the first panel is affixed to the base plate using a plurality of mechanical spacers located between the second main surface and the first panel, each one of the legs protruding through different, respective opening in the first panel without being directly secured to the first panel, the assembly being configured to freestand on a flat external surface via support of only the legs.

2. The apparatus of claim 1, wherein the legs form a mechanical pathway to transfer vibrational energy between the base plate and the external surface, the legs not contacting the first panel.

3. The apparatus of claim 1, further comprising an electronic controller to control the motor.

4. The apparatus of claim 3, further comprising a second panel of the housing edge-connected and substantially orthogonal to the first panel; and
wherein the electronic controller comprises a circuit board mechanically fixed to the second panel.

5. The apparatus of claim 4, wherein the circuit board is parallel to the second panel.

6. The apparatus of claim 3, wherein the electronic controller is in the housing.

7. The apparatus of claim 6,
wherein the motor is configured to drive an air compressor to pump air through a dehumidifying element; and
wherein the housing encloses therein the air compressor and the dehumidifying element.

8. The apparatus of claim 3, wherein the spacers are configured to provide damping of vibrations traveling between the base plate and the electronic controller when the motor is running.

9. The apparatus of claim 3, further comprising a gas valve;
wherein the motor is configured to drive an air compressor connected to the gas valve; and
wherein the electronic controller is configured to individually control the motor and the gas valve.

10. The apparatus of claim 1, wherein the spacers are configured to provide damping of vibrations traveling between the base plate and the first panel when the motor is running.

11. The apparatus of claim 1, wherein the first panel is substantially parallel to the base plate.

12. The apparatus of claim 1, wherein, at least, some of the legs do not contact the first panel.

13. The apparatus of claim 1, wherein the first panel does not have an additional leg directly attached thereto to assist the freestanding.

14. The apparatus of claim 1, wherein the base plate comprises:
a flat middle portion; and
one or more lips along a perimeter of the base plate.

15. The apparatus of claim 1, wherein the base plate comprises:
a plurality of flat portions; and
a plurality of grooves interleaved with the flat portions.

16. The apparatus of claim 1, wherein the base plate comprises:
a peripheral flat portion; and
a washboard-profiled middle portion.

17. The apparatus of claim 1, wherein the plurality of legs comprises at least three legs.

18. The apparatus of claim 1, wherein the mechanical spacers are in direct physical contact with and compressed between the base plate and the first panel.

19. An apparatus, comprising an assembly that comprises:
a base plate having opposing first and second main surfaces;
a motor mechanically affixed to the base plate over the first main surface;
a plurality of legs attached to the base plate and extending from the second main surface; and
a panel mechanically affixed to the base plate using a plurality of spacers, the spacers creating separation between the second main surface and the panel, each one of the legs protruding through a different, respective opening in the panel without being directly secured to the panel, the assembly being configured to freestand on a flat external surface via support of only the legs.

20. The apparatus of claim 19, wherein the plurality of legs comprises at least three legs.

21. The apparatus of claim 19, wherein the spacers are in direct physical contact with and compressed between the base plate and the panel.

* * * * *